United States Patent
Lee et al.

(10) Patent No.: US 10,069,112 B2
(45) Date of Patent: Sep. 4, 2018

(54) ORGANIC LIGHT EMITTING DIODE DISPLAY DEVICE

(71) Applicants: Samsung Display Co., Ltd., Yongin-si (KR); Industry Academic Cooperation Foundation Kyunghee University, Yongin-si (KR)

(72) Inventors: Hyesog Lee, Osan-si (KR); Jungho Kim, Seoul (KR); Jaejoong Kwon, Suwon-si (KR); Byungchoon Yang, Seoul (KR); Chio Cho, Gwanju (KR)

(73) Assignee: Samsung Display Co., Ltd., Yongin-si (KR)

( * ) Notice: Subject to any disclaimer, the term of this patent is extended or adjusted under 35 U.S.C. 154(b) by 60 days.

(21) Appl. No.: 15/175,668

(22) Filed: Jun. 7, 2016

(65) Prior Publication Data
US 2016/0372709 A1 Dec. 22, 2016

(30) Foreign Application Priority Data
Jun. 19, 2015 (KR) ........................ 10-2015-0087678

(51) Int. Cl.
| | |
|---|---|
| *H01L 51/52* | (2006.01) |
| *H01L 51/56* | (2006.01) |
| *H01L 51/00* | (2006.01) |
| *G03F 7/20* | (2006.01) |
| *G03F 7/32* | (2006.01) |
| *H01L 51/50* | (2006.01) |

(52) U.S. Cl.
CPC ............ *H01L 51/5268* (2013.01); *G03F 7/20* (2013.01); *G03F 7/32* (2013.01); *H01L 51/0016* (2013.01); *H01L 51/0034* (2013.01); *H01L 51/0081* (2013.01); *H01L 51/5275* (2013.01); *H01L 51/56* (2013.01); *H01L 51/5012* (2013.01)

(58) Field of Classification Search
None
See application file for complete search history.

(56) References Cited

U.S. PATENT DOCUMENTS

| | | | |
|---|---|---|---|
| 7,292,383 | B2 | 11/2007 | Verma et al. |
| 8,890,317 | B1 | 11/2014 | Koo et al. |
| 2006/0186801 | A1 | 8/2006 | West |

(Continued)

FOREIGN PATENT DOCUMENTS

KR   10-2014-0137196   12/2014

OTHER PUBLICATIONS

Tobias Bocksrocker et al., "Efficient waveguide mode extraction in white organic light emitting diodes using ITO-anodes with integrated MgF2-columns", OPTICS EXPRESS, vol. 20, No. 6, Mar. 2012, 6170-6174.

(Continued)

*Primary Examiner* — Lex Malsawma
(74) *Attorney, Agent, or Firm* — H.C. Park & Associates, PLC

(57) ABSTRACT

An organic light emitting diode display device, including a substrate, and at least one organic light emitting diode on the substrate, wherein the organic light emitting diode includes a first electrode on the substrate, an organic light emitting layer on the first electrode, and a second electrode on the organic light emitting layer, and the organic light emitting layer has at least one opening.

12 Claims, 13 Drawing Sheets

(56) References Cited

U.S. PATENT DOCUMENTS

| | | | |
|---|---|---|---|
| 2006/0232195 A1* | 10/2006 | Cok | H01L 51/5265 |
| | | | 313/504 |
| 2008/0265757 A1 | 10/2008 | Forrest et al. | |
| 2010/0201256 A1 | 8/2010 | Xue et al. | |
| 2011/0062481 A1* | 3/2011 | Oyamada | B82Y 20/00 |
| | | | 257/98 |
| 2011/0159252 A1 | 6/2011 | Ober et al. | |
| 2013/0236999 A1 | 9/2013 | Lee et al. | |
| 2014/0091292 A1 | 4/2014 | Baker et al. | |
| 2014/0127625 A1 | 5/2014 | Defranco et al. | |
| 2014/0131671 A1* | 5/2014 | Lee | H01L 51/0003 |
| | | | 257/40 |
| 2014/0183479 A1* | 7/2014 | Park | H01L 51/56 |
| | | | 257/40 |
| 2014/0322850 A1 | 10/2014 | Lee et al. | |

OTHER PUBLICATIONS

Krotkus et al., "Photo-patterning of Highly Efficient State-of-the-Art Phosphorescent OLEDs Using Orthogonal Hydrofluoroethers", Advanced Optical Materials, 2014, 2, 1043-1048.

www.orthogonalinc.com, available Aug. 7, 2013.

* cited by examiner

ORGANIC LIGHT EMITTING DIODE DISPLAY DEVICE

CROSS-REFERENCE TO RELATED APPLICATION

This application claims priority from and the benefit of Korean Patent Application No. 10-2015-0087678, filed on Jun. 19, 2015, which is hereby incorporated by reference for all purposes as if fully set forth herein.

BACKGROUND

Field

Exemplary embodiments relate to an organic light emitting diode ("OLED") display device with enhanced light extraction efficiency, and a method of manufacturing the OLED device.

Discussion of the Background

An organic light emitting diode display device is a self-emission-type display device that displays an image using an OLED element to emit light. Unlike liquid crystal display ("LCD") devices, OLED display devices do not require an additional light source. Thus, OLED display devices can be manufactured to be relatively slim and lightweight. In addition, OLED display devices are garnering attention as a next generation device because OLED display devices have low power consumption, high luminance, and rapid response rate.

An OLED display device may have a multilayer structure. Thus, light generated in a light emitting layer of the OLED display device is transmitted through the multilayer structure to be emitted externally. Since a significant amount of the light generated in the light emitting layer is lost through total reflection, the OLED display device has relatively low light emission efficiency.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light emitting diode display device with enhanced light emission efficiency.

Exemplary embodiments provide an OLED display device including an organic light emitting layer having an opening, and a method of manufacturing the OLED display device.

Additional aspects will be set forth in the detailed description which follows, and, in part, will be apparent from the disclosure, or may be learned by practice of the inventive concept.

An exemplary embodiment discloses an organic light emitting diode display device, including a substrate, and at least one organic light emitting diode on the substrate, wherein the organic light emitting diode includes a first electrode on the substrate, an organic light emitting layer on the first electrode, and a second electrode on the organic light emitting layer, and the organic light emitting layer has at least one opening.

An exemplary embodiment also discloses a method of manufacturing an organic light emitting diode display device, the method includes forming a first electrode on a substrate forming a lift-off pattern on the first electrode, forming an organic light emitting layer on the first electrode and on the lift-off pattern, forming a second electrode on the organic light emitting layer, and removing the lift-off pattern.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
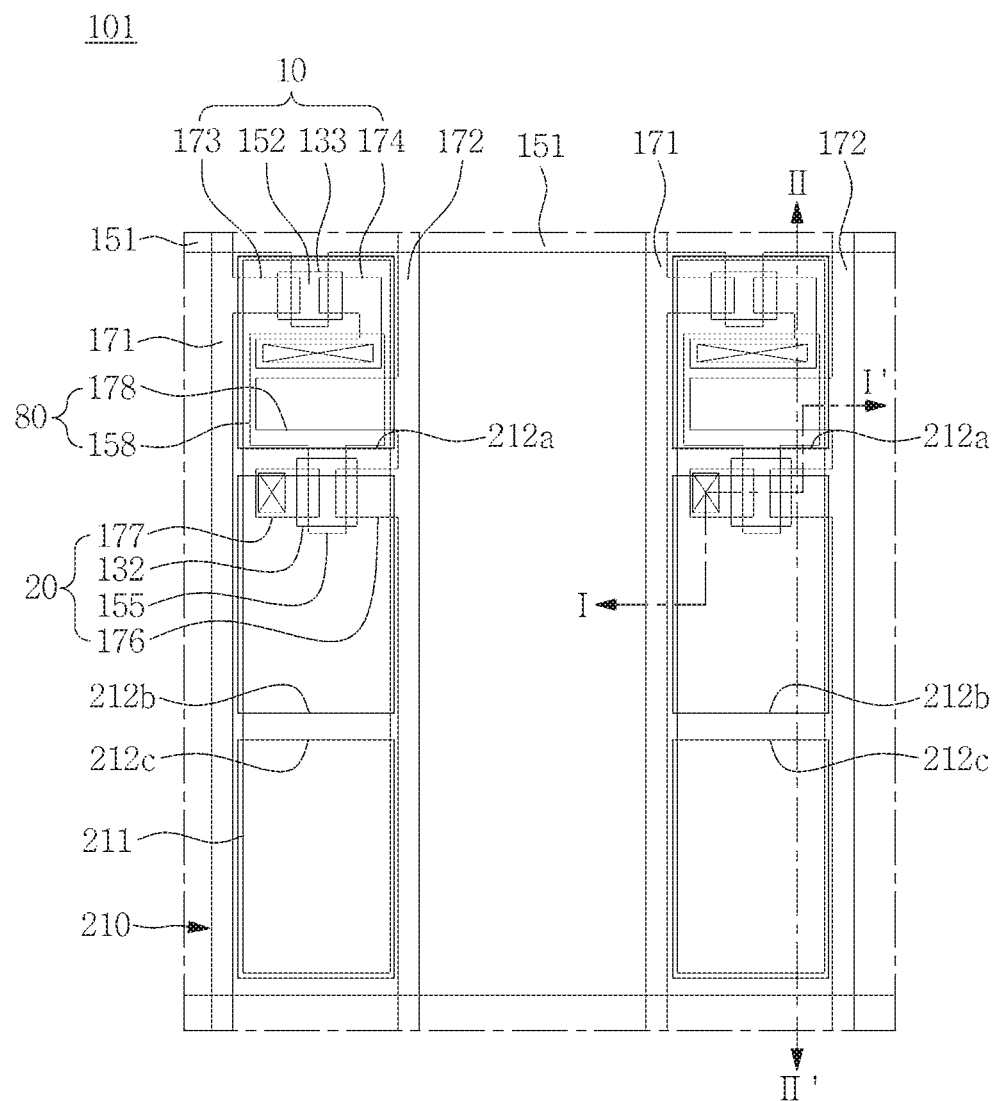
FIG. 1 is a plan view illustrating an organic light emitting diode display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, an organic light emitting diode display device 101 according to an exemplary embodiment will be described with reference to FIGS. 1, 2, and 3.

FIG. 1 is a plan view illustrating the OLED display device 101 according to an exemplary embodiment. FIG. 2 is a cross-sectional view taken along section line I-I' of FIG. 1. FIG. 3 is a cross-sectional view taken along section line II-II' of FIG. 1. In FIG. 3, a detailed structure of a wiring unit 131 and an encapsulation substrate 112 are omitted.

Figure 2:
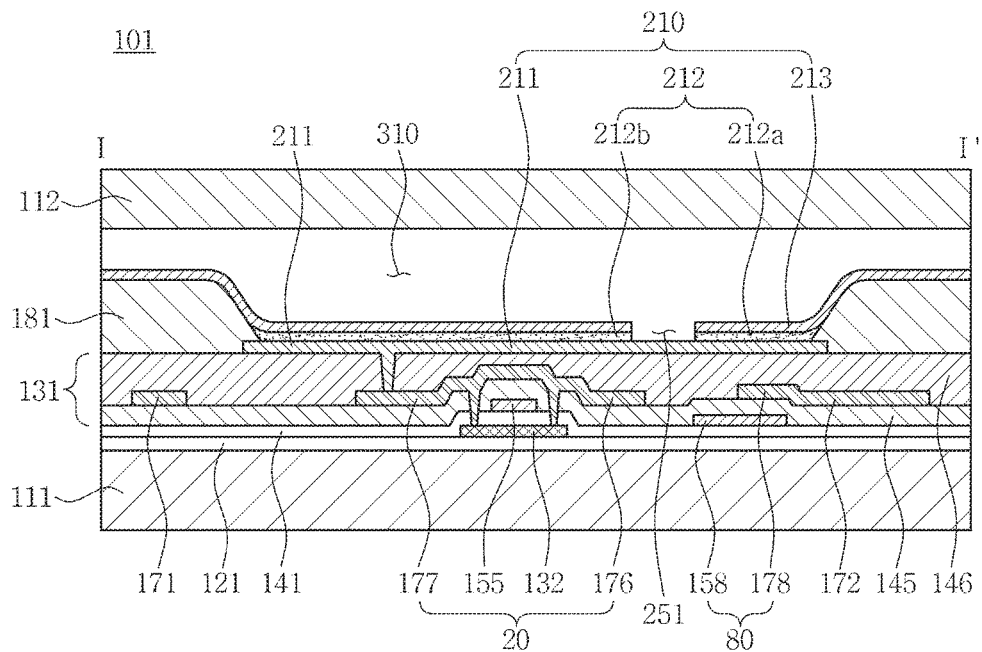
FIG. 2 is a cross-sectional view taken along section line I-I' of FIG. 1.

Referring to FIGS. 1 and 2, the OLED display device 101 may include a substrate 111, a wiring unit 131, an OLED 210, and an encapsulation substrate 112. As used herein, the substrate 111, the wiring unit 131, and the OLED 210 are collectively referred to as a display panel.

The substrate 111 may use an insulating substrate including at least one of glass, quartz, ceramic, and plastic. However, the substrate 111 may include any suitable material. In an exemplary embodiment the substrate 111 includes a metallic substrate. For example, the substrate 111 may be formed of stainless steel.

A buffer layer 121 may be disposed on the substrate 111. The buffer layer 121 may include one or more various inorganic and/or organic layers. The buffer layer 121 may serve to reduce or effectively prevent the infiltration of undesired components, such as impure elements and/or moisture, into the wiring unit 131 and/or the OLED 210. The buffer layer 121 may also planarize a surface of the substrate 111. However, the buffer layer 121 is not necessarily required, and may be omitted.

The wiring unit 131 may be disposed on the buffer layer 121. The wiring unit 131 may include a switching thin film transistor 10, a driving thin film transistor 20, and a capacitor 80. The wiring unit 131 may be configured to drive the OLED 210. The OLED 210 may display an image by emitting light based on a driving signal transmitted from the wiring unit 131.

FIGS. 1 and 2 illustrate the OLED display device 101 as an active matrix organic light emitting diode ("AMOLED") display device having a 2Tr-1Cap structure. The 2Tr-1Cap structure is where a single pixel includes two thin film transistors. For example, the switching thin film transistor 10 and the driving thin film transistor 20, and the capacitor 80 as the single capacitor. However, exemplary embodiments are not so limited. By way of example, the OLED display device 101 may have various structures. For example, a structure of the OLED display device 101 may include a single pixel having three or more thin film transistors and two or more capacitors as well as an additional wiring. As used herein, the term "pixel" refers to a minimum unit for displaying an image, and the OLED display device 101 displays an image through a plurality of pixels.

Each pixel may include the switching thin film transistor 10, the driving thin film transistor 20, the capacitor 80, and the OLED 210. A gate line 151 may be disposed in a first direction. A data line 171 insulated from and intersecting the gate 151 may be disposed in a second direction. A common power line 172 and the data line 171 may be provided in the wiring unit 131. A single pixel may be defined by the gate line 151, the data line 171, and the common power line 172. However, the definition of the pixel is not limited thereto. The pixel may be defined by a pixel defining layer ("PDL") 181 or a black matrix.

The OLED 210 may include a first electrode 211, an organic light emitting layer 212 on the first electrode 211, and a second electrode 213 on the organic light emitting layer 212. A hole and an electron from the first electrode 211 and the second electrode 213, respectively, are injected into the organic light emitting layer 212 to be combined with one another to form an exciton. The OLED 210 emits light by energy generated when the exciton falls from an excited state to a ground state.

The capacitor 80 may include a pair of capacitor plates 158 and 178 that are formed to have an insulating interlayer 145 therebetween. In such an embodiment, the insulating interlayer 145 may be a dielectric material. Capacitance of the capacitor 80 may be determined by an amount of electric charge stored in the capacitor 80 and a level of a voltage across the capacitor plates 158 and 178.

The switching thin film transistor 10 may include a switching semiconductor layer 133, a switching gate electrode 152, a switching source electrode 173, and a switching drain electrode 174. The driving thin film transistor 20 may include a driving semiconductor layer 132, a driving gate electrode 155, a driving source electrode 176, and a driving drain electrode 177. The switching semiconductor layer 133 and the driving semiconductor layer 132 may be insulated from the switching gate electrode 152 and the driving gate electrode 155 by a gate insulating layer 141.

The switching thin film transistor 10 may be used as a switching element that selects a pixel to perform light emission. The switching gate electrode 152 may be connected to the gate 151. The switching source electrode 173 may be connected to the data line 171. The switching drain electrode 174 may be formed to be spaced apart from the switching source electrode 173 and may be connected to one of the capacitor plates, for example, the capacitor plate 158.

The driving thin film transistor 20 may apply, to the first electrode 211, which is a pixel electrode, a driving power for allowing the organic light emitting layer 212 of the OLED 210 in the pixel selected by the switching thin film transistor 10, to perform light emission. The driving gate electrode 155 may be connected to the capacitor plate 158 that is connected to the switching drain electrode 174. The driving source electrode 176 and the other capacitor plate 178 may be connected to the common power line 172. The driving drain electrode 177 may be connected to the first electrode 211 of the OLED 210 through a contact hole.

The switching thin film transistor 10 may be operated by a gate voltage applied to the gate line 151 to thereby transmit a data voltage applied to the data line 171 to the driving thin film transistor 20. A voltage having a level that is substantially equal to a difference between the level of a data voltage transmitted by (or from) the switching thin film transistor 10 and the level of a common voltage applied from the common power line 172 to the driving thin film transistor 20 may be stored in the capacitor 80. A current having a level equivalent to the level of the voltage stored in the capacitor 80 may flow into the OLED 210 through the driving thin film transistor 20, whereby the OLED 210 emits light.

A planarization layer 146 may be disposed on the insulating interlayer 145. The planarization layer 146 may include an insulating material, and may protect the wiring unit 131. The planarization layer 146 and the insulating interlayer 145 may include same material.

The driving drain electrode 177 of the driving thin film transistor 20 may be connected to the first electrode 211 of the OLED 210 through the contact hole formed in the planarization layer 146.

According to an exemplary embodiment, the first electrode 211 is a reflective electrode, and the second electrode 213 is a transflective electrode. Accordingly, light generated in the organic light emitting layer 212 may be transmitted through the second electrode 213 to be emitted. In other words, the OLED display device 101 may be a top-emission-type display device. However, exemplary embodiments are not limited thereto.

The reflective electrode and the transflective electrode may include or be formed of one or more metals selected from magnesium (Mg), silver (Ag), gold (Au), calcium (Ca), lithium (Li), chromium (Cr), aluminum (Al), and copper (Cu), or an alloy thereof. In such an embodiment, the type of the first electrode 211 and the second electrode 213 (i.e., whether electrode is a reflective electrode or the transflective electrode), may be determined based on a thickness of the electrode. In general, the transflective electrode may have a thickness of about 200 nanometers nm) or less.

For example, the first electrode 211 may include a reflective layer including one or more metals of magnesium (Mg), silver (Ag), gold (Au), calcium (Ca), lithium (Li), chromium (Cr), aluminum (Al), and copper (Cu), and a transparent conductive layer on the reflective layer. In such an embodiment, the transparent conductive layer may include or be formed of transparent conductive oxide ("TCO"). Examples of the TCO may include at least one of indium-tin oxide (ITO), indium-zinc oxide (IZO), zinc oxide (ZnO), aluminum zinc oxide (AZO), and indium oxide ($In_2O_3$). Since the transparent conductive layer has a relatively high work function, hole injection through the first electrode 211 may be readily performed.

In addition, the first electrode 211 may have a triple-layer structure in which a transparent conductive layer, a reflective layer, and a transparent conductive layer are sequentially stacked.

The second electrode 213 may be formed of a transflective layer including one or more metals of magnesium (Mg), silver (Ag), gold (Au), calcium (Ca), lithium (Li), chromium (Cr), aluminum (Al), and copper (Cu).

Although not illustrated, at least one of a hole injection layer (HIL) and a hole transporting layer (HTL) may further be interposed between the first electrode 211 and the organic light emitting layer 212. In addition, at least one of an electron transporting layer (ETL) and an electron injection layer (EIL) may further be interposed between the organic light emitting layer 212 and the second electrode 213.

The organic light emitting layer 212, the hole injection layer (HIL), the hole transporting layer (HTL), the electron transporting layer (ETL), and the electron injection layer (EIL) are referred to as an organic layer. Such an organic layer may include a low molecular weight organic material and/or a high molecular weight organic material.

The pixel defining layer 181 may have an opening. The opening of the pixel defining layer 181 may expose a portion of the first electrode 211. The first electrode 211, the organic light emitting layer 212, and the second electrode 213 are sequentially stacked in the opening of the pixel defining layer 181. In this manner, the pixel defining layer 181 may be configured to define a light emission area. The second electrode 213 may be disposed on the pixel defining layer 181 as well as the organic light emitting layer 212.

The encapsulation substrate 112 may be disposed above the OLED 210 so as to be spaced apart from the second electrode 213. The encapsulation substrate 112 may use an insulating substrate. The encapsulation substrate 112 may include any suitable material. The encapsulation substrate 112 may include at least one of glass, quartz, ceramic, and plastic. The encapsulation substrate 112 may be adhered as a sealant to the substrate 111 to cover and protect the OLED 210. A sealant (not illustrated) may be disposed on edge portions of the substrate 111 and the encapsulation substrate 112.

The OLED display device 101 may include an inert gas layer 310 provided in a space between the encapsulation substrate 112 and the OLED 210. An inert gas injected into the inert gas layer 310 may include nitrogen ($N_2$). The inert gas layer 310 has a refractive index in a range of about 1.0 to about 1.1 which is similar to a refractive index of air.

The organic light emitting layer 212 in the OLED 210 may have an opening 251. The opening 251 is positioned in the first electrode 211, and divides the organic light emitting layer 212 into portions. Hereinafter, the divided portions of the organic light emitting layer 212 by opening 251 are correspondingly referred to as light emission patterns 212a, 212b, and 212c.

Figure 3:
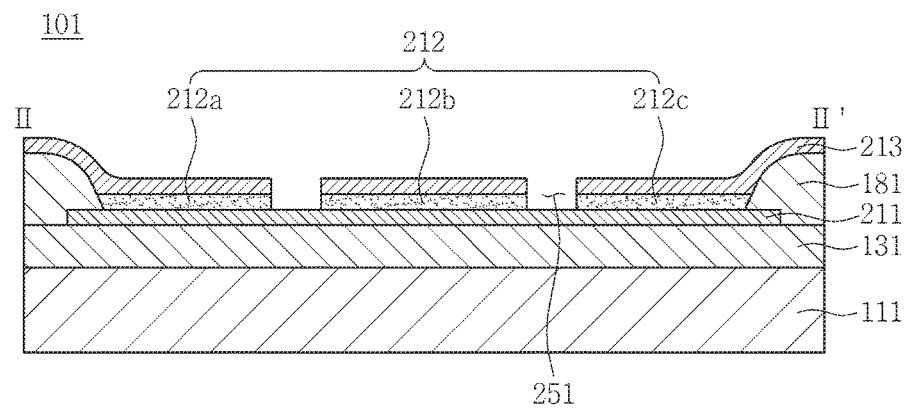
FIG. 3 is a cross-sectional view taken along section line II-II' of FIG. 1.

Referring to FIGS. 1, 2, and 3, each of the organic light emitting layers 212 has two openings 251. Each organic light emitting layers 212 is divided into three light emission patterns 212a, 212b, and 212c by the two openings 251. In such an embodiment, light emission may be performed in each of the light emission patterns 212a, 212b, and 212c.

Referring to FIG. 1, the opening 251 may have a slit shape when viewed from a plan view.

The shape and the number of openings 251 may vary based on the size of the organic light emitting layer 212, the purpose of use of the OLED display device 101, and the like. For example, the opening 251 may have one of a circular shape, a polygonal shape, and a cross (+) shape, in addition to the slit shape, when viewed from a plan view. Further, a single organic light emitting layer 212 may have any number of openings 251. For example, a single organic light emitting layer 212 may have one to twenty or more openings 251.

Air and/or an inert gas may be filled in the opening 251. Air and/or an inert gas has a refractive index lower than the organic light emitting layer 212. As described hereinabove, the opening 251 filled with a low-refractive index material is referred to as a low-refractive index portion.

Nitrogen ($N_2$), which is an inert gas, may be filled in the opening 251 to form a low-refractive index portion.

The organic light emitting layer 212 may have a refractive index that is higher than that of the low-refractive index portion, in a degree of about 0.1 or greater. In light of the fact that the organic light emitting layer 212 has a refractive index of about 1.5 or higher, more particularly, in a range of about 1.5 to about 1.8, the low-refractive index portion may have a refractive index in a range of about 1.0 to about 1.4.

Since the organic light emitting layer 212 has a refractive index higher than the opening 251 and/or the low-refractive index portion, side walls of the organic light emitting layer 212 divided by the opening 251 may serve as optical reflective layers. In other words, side walls of the light emission patterns 212a, 212b, and 212c may serve as optical reflective layers. Accordingly, total reflection within the OLED 210 is reduced such that the light efficiency of the OLED display device 101 may be enhanced.

The light generated in the organic light emitting layer 212 is transmitted through various layers constituting the OLED display device 101 so as to be externally emitted through the second electrode 213. However, since refractive indices of the respective layers constituting the OLED display device 101 are different from one another, light may be refracted or reflected at an interface between adjacent ones of the layers. Accordingly, when the light generated in the organic light emitting layer 212 is externally emitted, a considerable amount of the light is lost by being repeatedly reflected at the interface between adjacent ones of the layers or is lost by being totally reflected therein. In detail, when the light is totally reflected between two adjacent layers, an interface between the two layers is to serve as a waveguide, and the light is lost while being propagated along the interface.

Figure 4A:
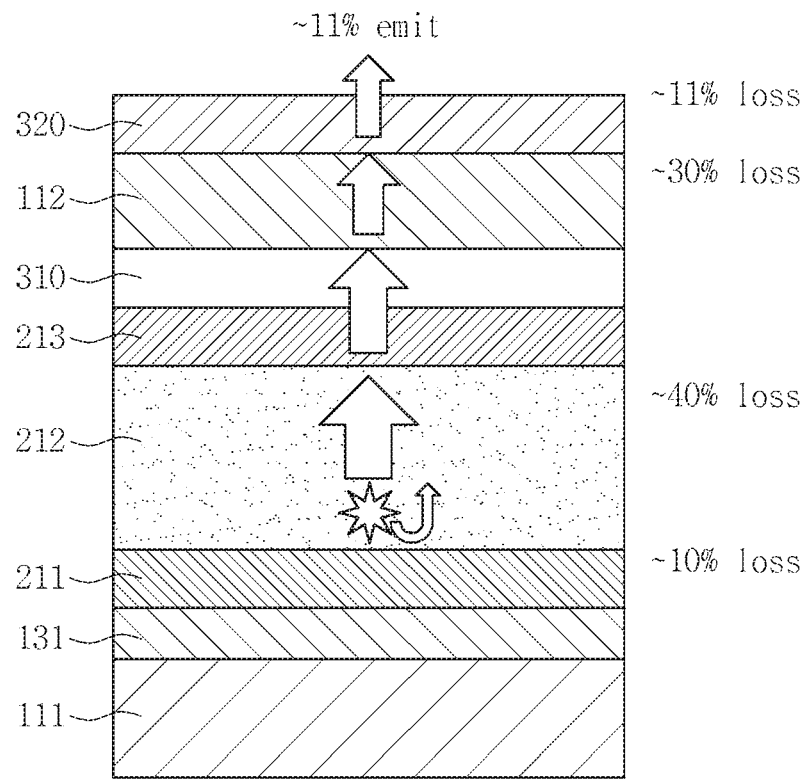
FIG. 4A is a schematic view illustrating the light loss of an OLED display device according to a related art.

FIG. 4A is a schematic view illustrating the light loss of an OLED display device according to a related art.

Referring to FIG. 4A, with respect to light generated in an organic light emitting layer 212, about 10% of the light is lost in a course of being reflected on a first electrode 211, about 40% thereof is lost by formation of a waveguide or by total reflection, and about 30% thereof is lost in a course of being transmitted through a second electrode 213 and an encapsulation layer 112. In addition, the OLED display device includes a polarizer 320 for preventing external light reflection, and about 11% of the light is lost in a course of being transmitted through the polarizer 320. Accordingly, about 11% of the light generated in the organic light emitting layer 212 is externally emitted.

Figure 4B:
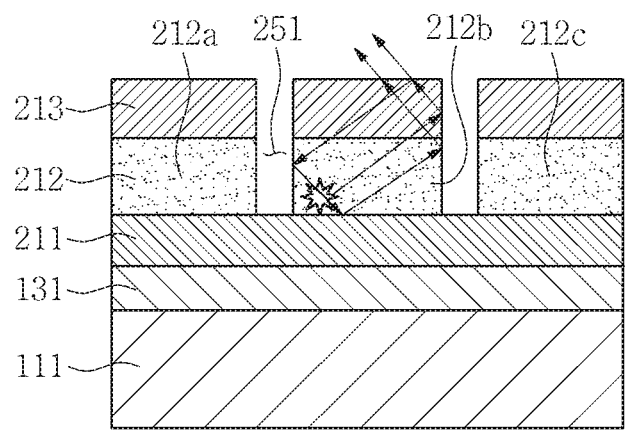
FIG. 4B is a schematic view illustrating the light extraction of the OLED display device according to an exemplary embodiment.

FIG. 4B is a schematic view illustrating the light extraction of the OLED display device 101 according to an exemplary embodiment.

Referring to FIG. 4B, the side walls of the organic light emitting layer 212 divided by the opening 251 serve as reflective layers. In a case in which the side wall of the organic light emitting layer 212 reflects light, light that is horizontally propagated along an interface between the organic light emitting layer 212 and another layer may be emitted externally. In other words, a phenomenon in which the light generated in the organic light emitting layer 212 is horizontally propagated along the interface between the organic light emitting layer 212 and another layer to thereby be lost may be suppressed. In such an embodiment, as a difference between refractive indices of the organic light emitting layer 212 and the opening 251 increases, reflectivity a increase to thereby enhance the total reflection preventing effect.

The light generated in the organic light emitting layer 212 may have a coherence length in a range of about 3 micrometers (μm) to about 10 μm. To prevent the interference of the light generated in the organic light emitting layer 212 in the course of being transmitted to the interface between adjacent layers and the amplification of the light by the interference, a side of each of the light emission patterns 212a, 212b, and 212c which are divided by the opening 251 may be designed to have a length of about 3 μm or less. For example, each of the light emission patterns 212a, 212b, and 212c may have a planar area of about (1 to 3 μm) by (1 to 3 μm).

In addition, the organic light emitting layer 212 may have a thickness in a range of about 100 nm to about 300 nm or may have a thickness of about 300 nm or more.

The second electrode 213 may be a common electrode. Referring to FIGS. 1, 2, and 3, the second electrode 213 on the organic light emitting layer 212 may have an opening having the same shape as the opening 251 of the organic light emitting layer 212. Although the second electrode 213 is divided into portions by such an opening, the divided portions of the second electrode 213 extend onto the pixel defining layer 181 to be connected to one another. Accordingly, an electron may be easily injected throughout an entire area of the second electrode 213 to drive the OLED 210.

Figure 6:
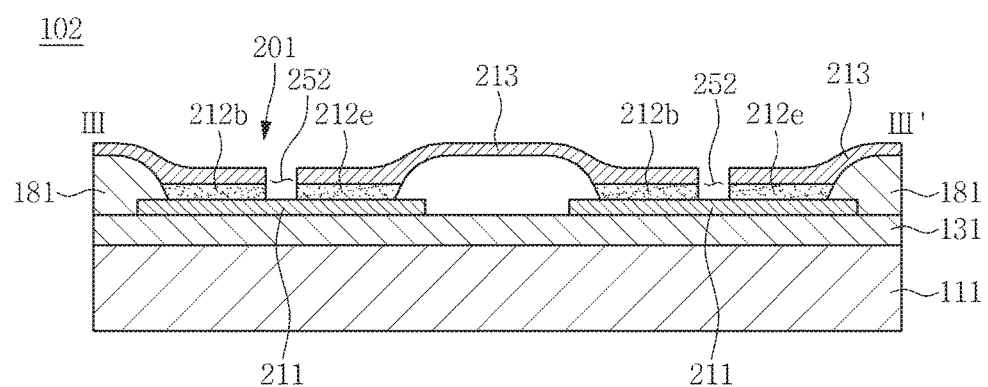
FIG. 6 is a cross-sectional view taken along section line III-III' of FIG. 5.
Figure 7:
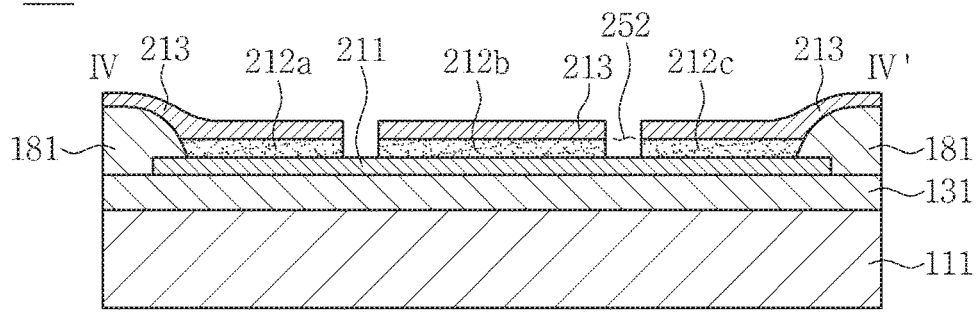
FIG. 7 is a cross-sectional view taken along section line IV-IV' of FIG. 5.

Hereinafter, an OLED display device 102 according to an exemplary embodiment will be described with reference to FIGS. 5, 6, and 7.

Figure 5:
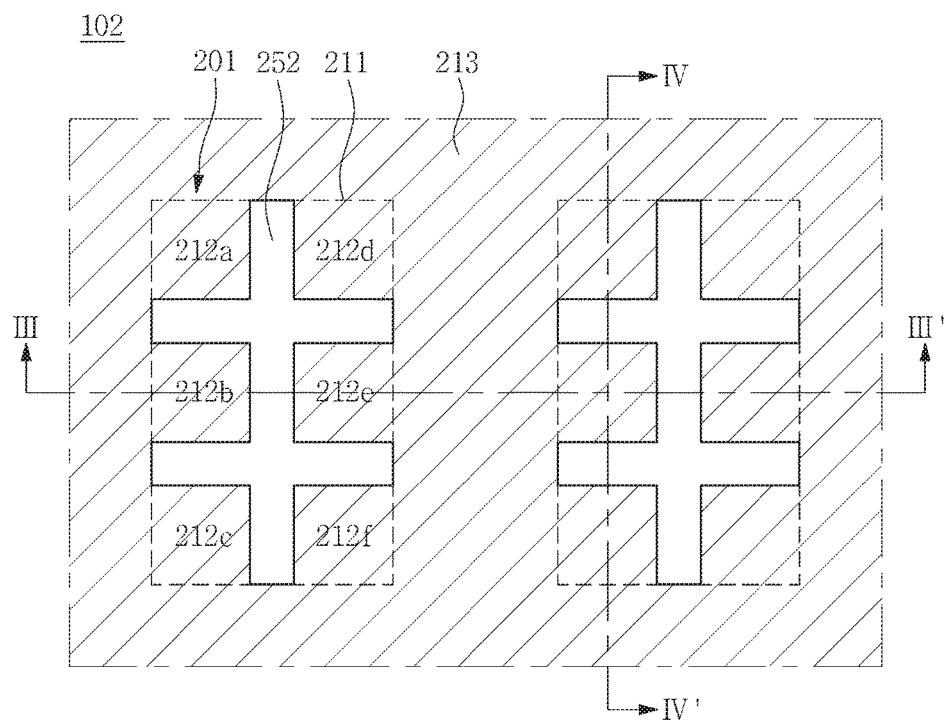
FIG. 5 is a plan view illustrating an OLED display device according to an exemplary embodiment.

FIG. 5 is a plan view illustrating the OLED display device 102 according to an exemplary embodiment. FIG. 6 is a cross-sectional view taken along section line III-III' of FIG. 5. FIG. 7 is a cross-sectional view taken along section line IV-IV' of FIG. 5. In FIGS. 5, 6, and 7, a detailed structure of a wiring unit 131 is omitted.

A detailed description on components described in the foregoing will be omitted herein to avoid a repetition.

Referring to FIG. 5, an organic light emitting layer 212 may include an opening 252 having a shape in which two cross (+) shapes are combined. The organic light emitting layer 212 may be divided into six areas of light emission patterns 212a, 212b, 212c, 212d, 212e, and 212f by the opening 252. In other words, the organic light emitting layer 212 may have the six light emission patterns 212a, 212b, 212c, 212d, 212e, and 212f.

A second electrode 213 may have an opening having the same shape as the opening 252 of the organic light emitting layer 212. In other words, the second electrode 213 disposed on the organic light emitting layer 212 may also be divided into six areas. The divided portions of the second electrode 213 may extend onto a pixel defining layer 181 to be connected to one another, and may be connected to a second electrode 213 of an adjacent pixel 201.

According to an exemplary embodiment, the opening 252 is filled with nitrogen ($N_2$), which is an inert gas. The opening 252 may be filled with nitrogen ($N_2$) to serve as a low-refractive index portion. Accordingly, side walls of the light emission patterns 212a, 212b, 212c, 212d, 212e, and 212f may serve as reflective layers, to thereby enhance the light extraction efficiency of the OLED display device 102.

Hereinafter, an OLED display device 103 according to an exemplary embodiment will be described with reference to FIG. 8.

Figure 8:
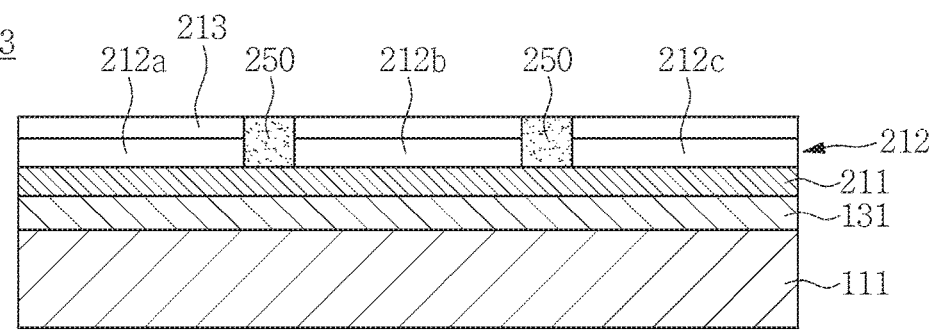
FIG. 8 is a cross-sectional view illustrating an OLED display device according to an exemplary embodiment.

FIG. 8 is a cross-sectional view illustrating the OLED display device 103 according to an exemplary embodiment. The OLED display device 103 according to an exemplary embodiment includes a low-refractive-index portion 250 formed by filling a low-refractive-index material in an opening of an organic light emitting layer 212.

Referring to FIG. 8, the organic light emitting layer 212 may be divided into a plurality of light emission patterns 212a, 212b, and 212c by the low-refractive-index portion 250. A difference between refractive indices of the light emission patterns 212a, 212b, and 212c and the low-refractive-index portion 250 is about 0.1 or more. For example, when the light emission patterns 212a, 212b, and 212c have a first refractive index and the low-refractive-index portion 250 has a second refractive index, the difference between the first refractive index and the second refractive index is greater than or equal to 0.1. This is represented by Equation 1:

First refractive index−Second refractive index≥0.1  (Equation 1)

The difference between the first refractive index and the second refractive index may be less than or equal to 0.5. Thus, the difference between the first refractive index and the second refractive index may satisfy Equation 2:

0.5≥(First refractive index−Second refractive index) ≥0.1  (Equation 2)

In light of the fact that the organic light emitting layer 212 has a refractive index in a range of about 1.5 to about 1.8, the low-refractive index portion 250 may have a refractive index in a range of about 1.0 to about 1.4. In particular, the low-refractive index portion 250 may have a refractive index of about 1.2 or less.

The low-refractive index portion 250 may include at least one low-refractive-index material. The low-refractive index portion may include at least one of $CaF_2$, NaF, $Na_3AlF_6$, SiOx, $AlF_3$, LiF, $MgF_2$, $Alq_3$ (Tris(8-hydroxyquinolinato) aluminum), an acrylic resin, a polyimide resin, and a polyamide resin.

Although side walls of the light emission patterns 212a, 212b, and 212c serve as reflective layers, a portion of light generated in the light emission patterns 212a, 212b, and 212c may flow into the low-refractive index portion 250. To help the emission of the portion of the light flowing into the low-refractive index portion 250, the low-refractive index portion 250 may include light-scattering particles (not illustrated). The light-scattering particle may have a diameter in a range of about 0.1 nm to about 100 nm. Examples of the light-scattering particle may include organic or inorganic particles well known in the art.

Hereinafter, an OLED display device 104 according to an exemplary embodiment will be described with reference to FIG. 9.

Figure 9:
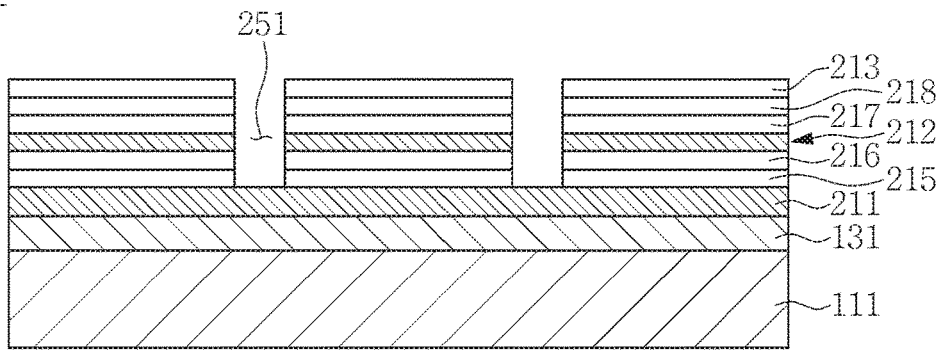
FIG. 9 is a cross-sectional view illustrating an OLED display device according to an exemplary embodiment.

FIG. 9 is a cross-sectional view illustrating the OLED display device 104 according to an exemplary embodiment. The OLED display device 104 may include a hole injection layer (HIL) 215 on a first electrode 211, a hole transporting layer (HTL) 216 on the hole injection layer (HIL) 215, an electron transporting layer (ETL) 217 on an organic light emitting layer 212, and an electron injection layer (EIL) 218 on the electron transporting layer (ETL) 217.

The organic light emitting layer 212, the hole injection layer (HIL) 215, the hole transporting layer (HTL) 216, the electron transporting layer (ETL) 217, and the electron injection layer (EIL) 218 are referred to as an organic layer. The organic layer may include a low molecular weight organic material and/or a high molecular weight organic material.

According to an exemplary embodiment, the organic layer has a divided structure having the same shape as a divided structure of the organic light emitting layer 212. An opening 251 between the divided portions of the organic layer may be filled with an inert gas such as nitrogen ($N_2$).

Hereinafter, an OLED display device 105 according to an exemplary embodiment will be described with reference to FIG. 10.

Figure 10:
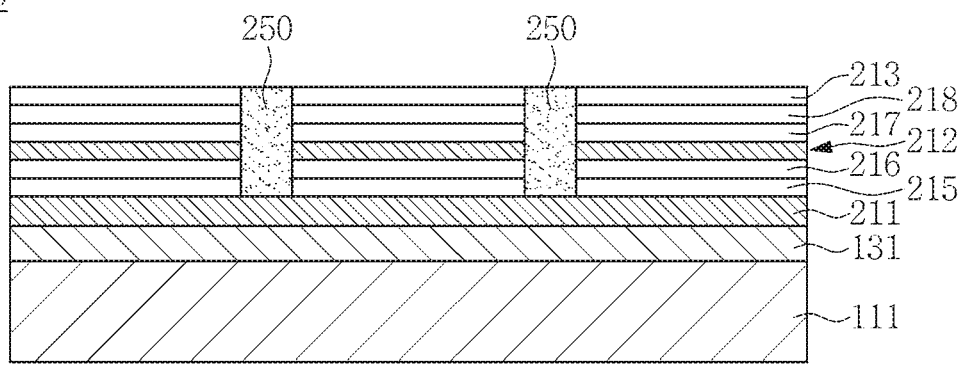
FIG. 10 is a cross-sectional view illustrating an OLED display device according to an exemplary embodiment.

FIG. 10 is a cross-sectional view illustrating the OLED display device 105 according to an exemplary embodiment. The OLED display device 105 may have a low-refractive-index portion 250. The low-refractive-index portion 250 may be formed by filling a low-refractive-index material in the opening 251 of the OLED display device 104.

Hereinafter, an OLED display device 106 according to an exemplary embodiment will be described with reference to FIG. 11.

Figure 11:
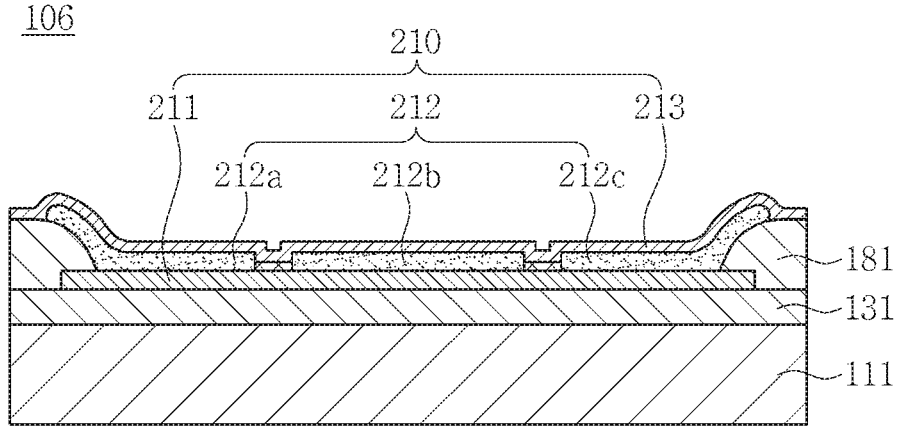
FIG. 11 is a cross-sectional view illustrating an OLED display device according to an exemplary embodiment.

FIG. 11 is a cross-sectional view illustrating the OLED display device 106 according to an exemplary embodiment. Referring to FIG. 11, a second electrode 213 may be disposed in an opening of an organic light emitting layer 212. In detail, the second electrode 213 is disposed on light emission patterns 212a, 212b, and 212c formed by dividing the organic light emitting layer 212, and extends onto the opening between adjacent ones of the light emission patterns 212a, 212b, and 212c so as to be integrally connected thereto.

The second electrode 213 may be disposed on side walls of the light emission patterns 212a, 212b, and 212c in the opening between adjacent ones of the light emission patterns 212a, 212b, and 212c.

The second electrode 213 disposed on the side walls of the light emission patterns 212a, 212b, and 212c may serve as a reflective layer. Accordingly, the light extraction efficiency of the OLED display device 106 may be enhanced.

Hereinafter, other structures of a second electrode 213 will be described with reference to FIGS. 12A and 12B.

Figure 12A:
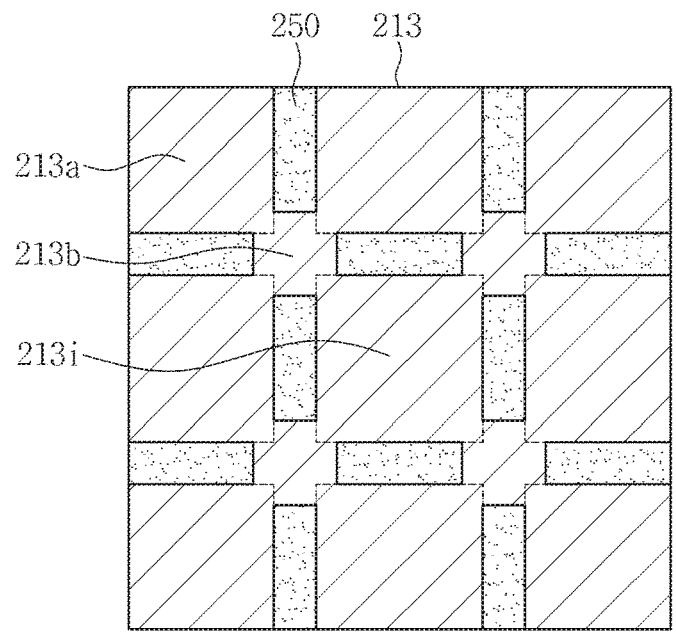
FIGS. 12A and 12B are plan views illustrating second electrodes of OLED display devices according to exemplary embodiments.
Figure 12B:
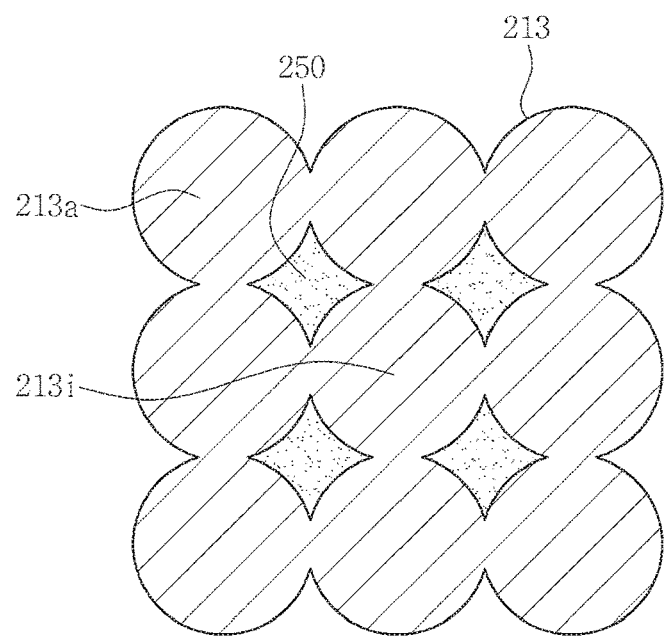

FIGS. 12A and 12B are plan views illustrating second electrodes 213 of OLED display devices according to exemplary embodiments.

The second electrode 213 of FIG. 12A may include sub-patterns 213a and 213i divided by a low-refractive-index portion 250, and a connecting portion 213b connecting the sub-patterns 213a and 213i to one another.

Referring to FIG. 12A, the sub-patterns 213a and 213i may have a quadrangular planar shape, and may be divided into an outer sub-pattern 213a and an inner sub-pattern 213i. As the sub-patterns 213a and 213i may be connected to one another by the connecting portion 213b, an electron may be supplied to the inner sub-pattern 213i in a pixel region.

The low-refractive-index portion 250 may be disposed below the connecting portion 213b. In addition, an organic light emitting layer (not illustrated) may be disposed below the connecting portion 213b. According to an alternative exemplary embodiment, the connecting portion 213b may directly contact a first electrode without an additional member below the connecting portion 213b.

The second electrode 213 of FIG. 12B may include a plurality of circular sub-patterns 213a and 213i divided by a low-refractive-index portion 250, and the plurality of circular sub-patterns 213a and 213i are connected to one another. Accordingly, an electron may be supplied to an inner sub-pattern 213i in a pixel region.

Hereinafter, a method of manufacturing the OLED display device 101 according to an exemplary embodiment will be described with reference to FIGS. 13A to 13G. FIGS. 13A, 13B, 13C, 13D, 13E, and 13G are views illustrating processes of the method of manufacturing the OLED display device 101 according to an exemplary embodiment, and respectively correspond to cross-sectional views taken along section line II-II' of FIG. 1.

Figure 13A:
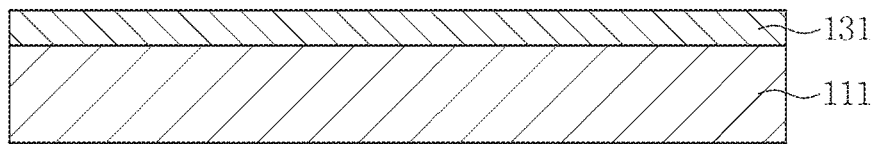
FIGS. 13A, 13B, 13C, 13D, 13E, and 13G are views illustrating processes of a method of manufacturing the OLED display device according to an exemplary embodiment.

Referring to FIG. 13A, the wiring unit 131 may be formed on the substrate 111. Since the wiring unit 131 is described above, a detailed structure of the wiring unit 131 and a manufacturing method thereof will be omitted for brevity.

Figure 13B:
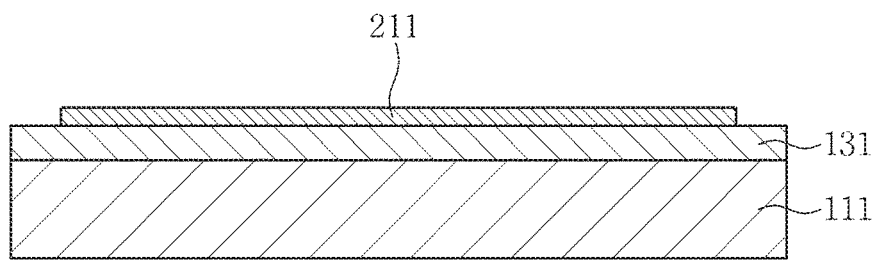

Referring to FIG. 13B, the first electrode 211 may be formed on the wiring unit 131. The first electrode 211 may include a reflective layer and a transparent conductive layer on the reflective layer.

Figure 13C:
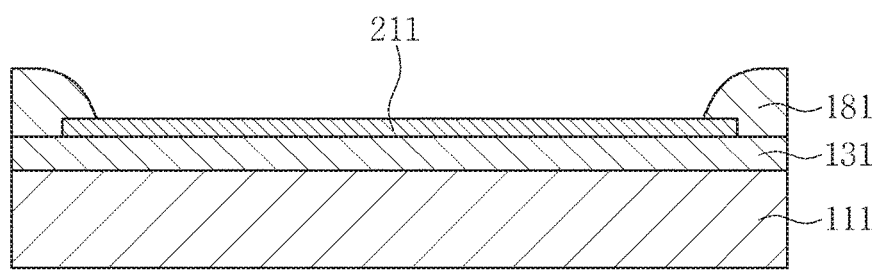

Referring to FIG. 13C, the pixel defining layer 181 may be formed on the wiring unit 131. The pixel defining layer 181 may be disposed between adjacent ones of the first electrodes 211, and may overlap an end portion of the first electrode 211.

Figure 13D:
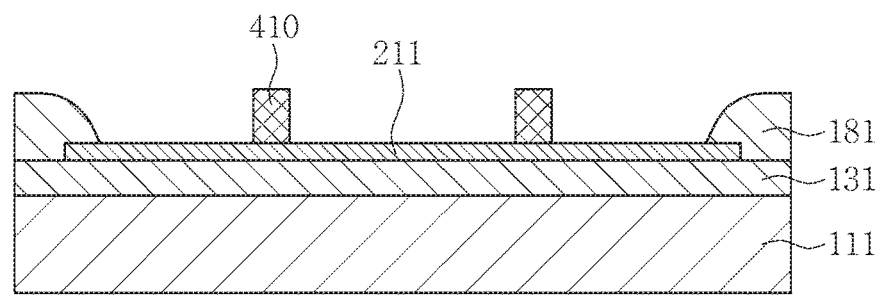

Referring to FIG. 13D, a lift-off pattern 410 may be formed on the first electrode 211. The lift-off pattern 410 may include a fluorinated polymer compound. For example, the lift-off pattern 410 may include orthogonal semiconductor resist (OSCoR™) which is a fluorinated resist.

A surface of the first electrode 211 may be divided into a plurality of regions by the lift-off pattern 410.

Figure 13E:
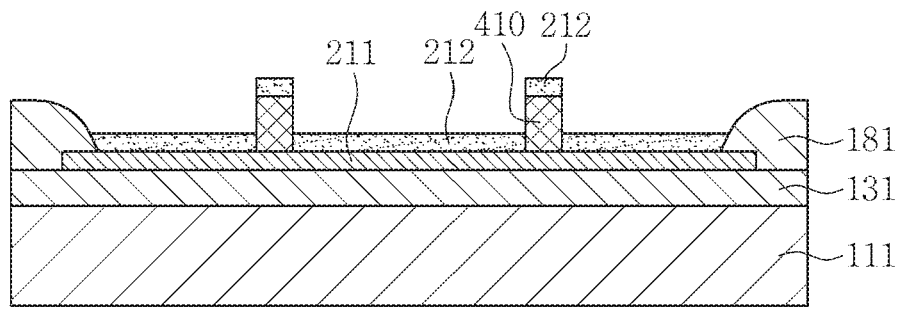

Referring to FIG. 13E, the organic light emitting layer 212 may be formed on the first electrode 211. In detail, the organic light emitting layer 212 may be formed in the opening of the first electrode 211, and may be also formed on the lift-off pattern 410.

Figure 13F:
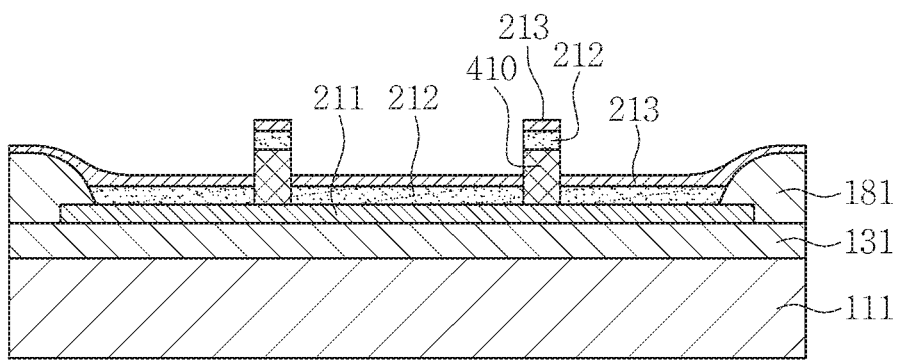

Referring to FIG. 13F, the second electrode 213 may be formed on the organic light emitting layer 212. In addition, the second electrode 213 may be formed on the organic light emitting layer 212 that is on the lift-off pattern 410.

Figure 13G:
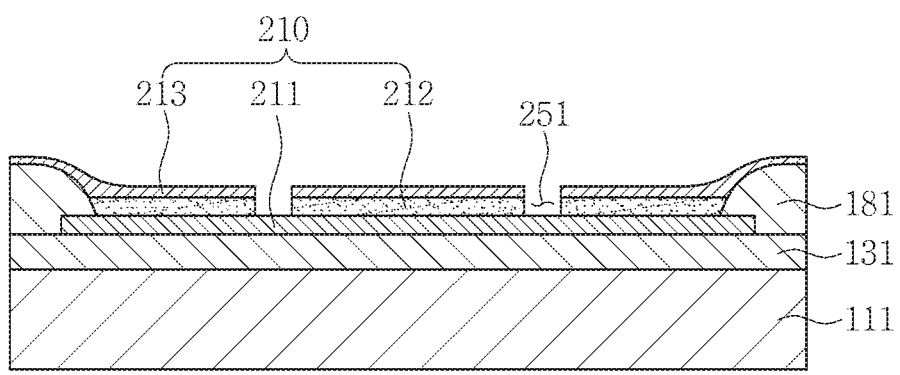

Referring to FIG. 13G, the lift-off pattern 410 may be removed.

The removing of the lift-off pattern 410 may include using a fluorinated solvent. In detail, the lift-off pattern 410 may be removed by dissolving the lift-off pattern 410 using the fluorinated solvent. In such an embodiment, the fluorinated solvent may be hydrofluoroether ("HFE"). Examples of HFE may include a compound represented by Chemical Formula 1 and/or a compound represented by Chemical Formula 2.

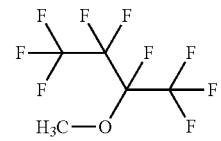

(Chemical Formula 1)

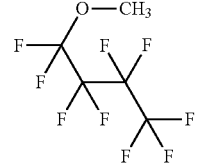

(Chemical Formula 2)

The fluorinated solvent used in the removing of the lift-off pattern 410 may include a mixture of the compound represented by Chemical Formula 1 and the compound represented by Chemical Formula 2.

When the lift-off pattern 410 is removed, the organic light emitting layer 212 and the second electrode 213 that are coated on the lift-off pattern 410 are also removed.

As the lift-off pattern 410 is removed, the opening 251 may be formed to divide the organic light emitting layer 212 into the plurality of light emission patterns 212a, 212b, and 712c.

Although not illustrated, a low refractive index material having a refractive index lower than the organic light emitting layer 212 may be filled in the opening 251 formed by removing the lift-off pattern 410. In this case, the low-refractive-index material filled in the opening 251 forms a low-refractive-index portion.

Subsequent to the lift-off pattern 410 being removed, a material for forming a second electrode may further be coated (not illustrated). In this case, a deposition scheme may be applied, and the material for forming the second electrode may be deposited on the opening 251 and the side walls of the light emission patterns 212a, 212b, and 212c, in addition to on the second electrode 213.

Subsequently, the encapsulation substrate 112 may be disposed above the OLED 210 to be spaced apart from the second electrode 213, to form the OLED display device 101. In such an embodiment, a sealant (not illustrated) may be disposed on edge portions of the substrate 111 and the encapsulation substrate 112.

Hereinafter, a method of manufacturing the lift-off pattern 410 will be described in greater detail with reference to FIGS. 14A, 14B, 14C, 14D, 14E, and 14F. FIGS. 14A, 14B, 14C, 14D, 14E, and 14F are views illustrating processes of the method of manufacturing the lift-off pattern 410.

Figure 14A:
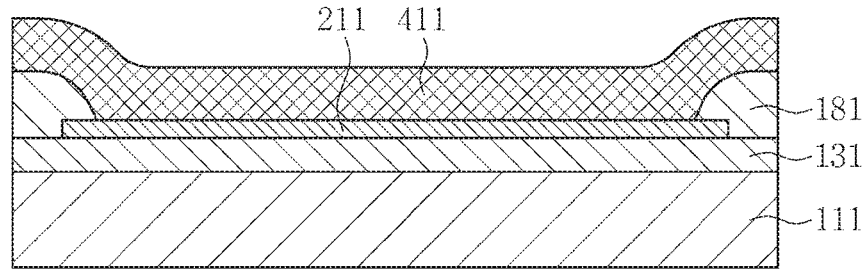
FIGS. 14A, 14B, 14C, 14D, 14E, and 14F are views illustrating processes of a method of manufacturing a lift-off pattern according to an exemplary embodiment.

Referring to FIG. 14A, the wiring unit 131, the first electrode 211, and the pixel defining layer 181 may be formed on the substrate 111. A fluorinated polymer compound 411 for forming the lift-off pattern 410 may be coated on the first electrode 211 and the pixel defining layer 181.

Examples of the fluorinated polymer compound 411 may include compound orthogonal semiconductor resist (OS-CoR™) which is a fluorinated resist.

Figure 14B:
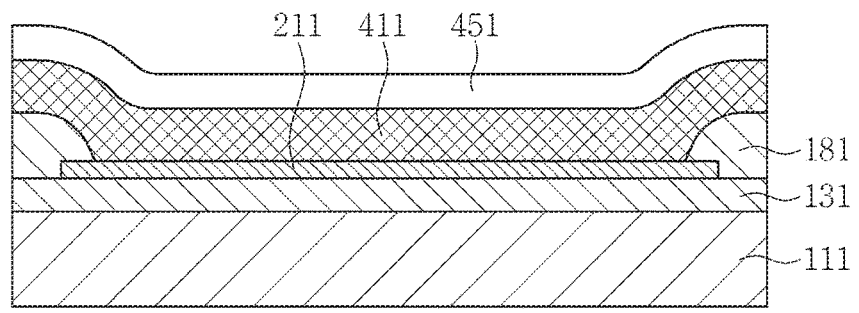

Referring to FIG. 14B, a photoresist 451 may be coated on the fluorinated polymer compound 411. Examples of the photoresist 451 may include a well-known photoresist used to form a compound pattern. The photoresist 451 of FIG. 14B may be a positive-type photoresist in which an exposed portion is developed.

Figure 14C:
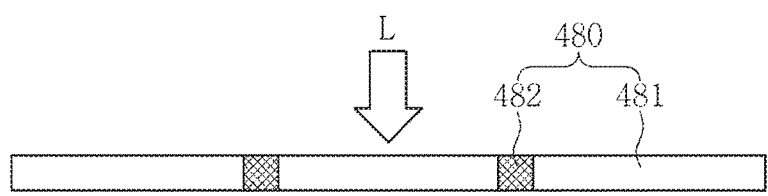
Figure 14C:
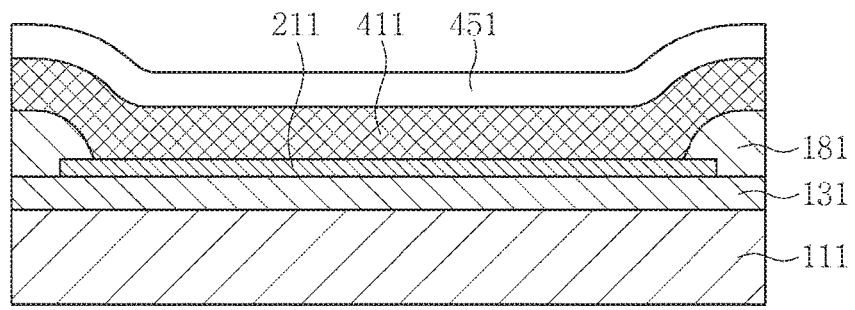

Referring to FIG. 14C, an exposure mask 480 may be provided above the photoresist 451, and light L is irradiated through the exposure mask 480 to thereby selectively develop the photoresist 451. The exposure mask 480 may use a pattern mask including a light-transmissive portion 481 and a light-blocking portion 482.

Figure 14D:
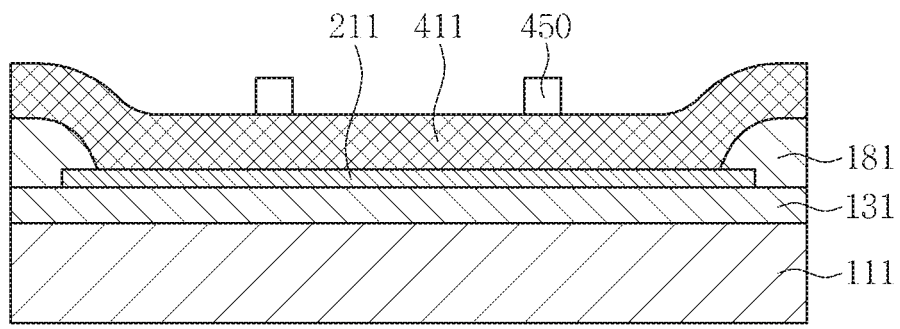

Referring to FIG. 14D, the exposed photoresist 451 may be developed to form a photoresist pattern 450.

Figure 14E:
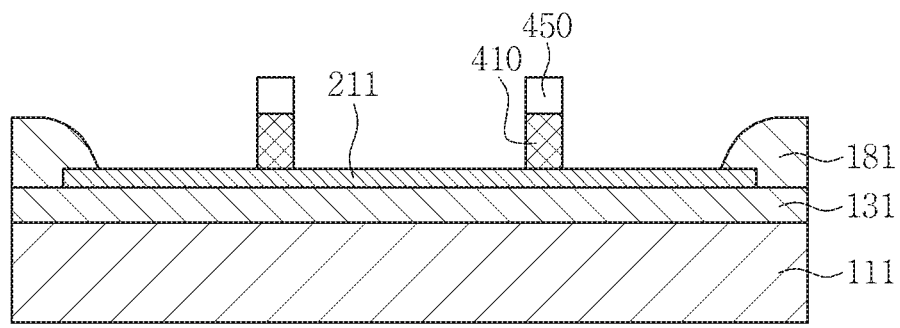

Referring to FIG. 14E, the fluorinated polymer compound 411 may be etched using the photoresist pattern 450 as a mask. The lift-off pattern 410 is formed by etching the fluorinated polymer compound 411.

Figure 14F:
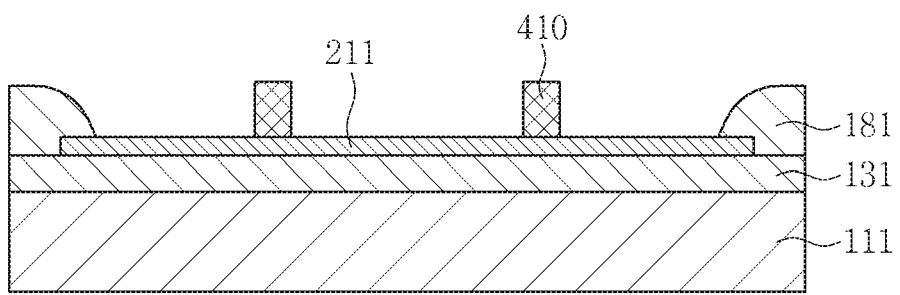

Referring to FIG. 14F, the photoresist pattern 450 on the lift-off pattern 410 is removed to complete the lift-off pattern 410.

Hereinafter, a method of manufacturing the OLED display device 106 according to an exemplary embodiment will be described in greater detail with reference to FIGS. 15A, 15B, 15C, 15D, 15E, and 15F. FIGS. 15A, 15B, 15C, 15D, 15E, and 15F are views illustrating processes of a method of manufacturing the OLED display device according to an exemplary embodiment.

Figure 15A:
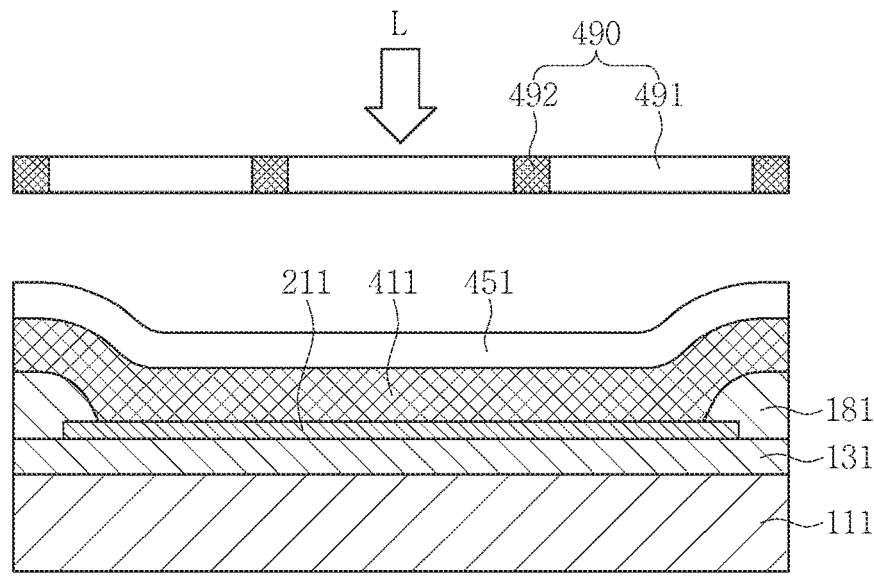
FIGS. 15A, 15B, 15C, 15D. 16E, and 15F are views illustrating processes of a method of manufacturing the OLED display device according to an exemplary embodiment.

Referring to FIG. 15A, the wiring unit 131, the first electrode 211, and the pixel defining layer 181 may be formed on the substrate 111. A fluorinated polymer compound 411 may be coated over the first electrode 211 and the pixel defining layer 181. A photoresist 451 may be coated on the fluorinated polymer compound 411.

Subsequently, a mask 490 may be provided above the photoresist 451, and light L may be irradiated through the mask 490 to thereby selectively develop the photoresist 451. The mask 490 may use a pattern mask including a light-transmissive portion 491 and a light-blocking portion 492.

Figure 15B:
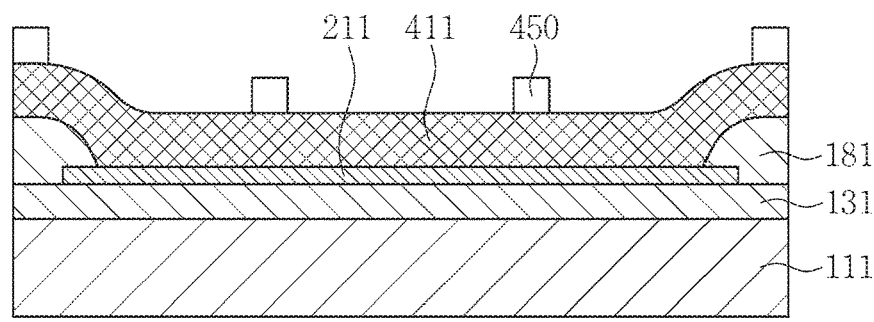

Referring to FIG. 15B, the exposed photoresist 451 may be developed to form a photoresist pattern 450.

Figure 15C:
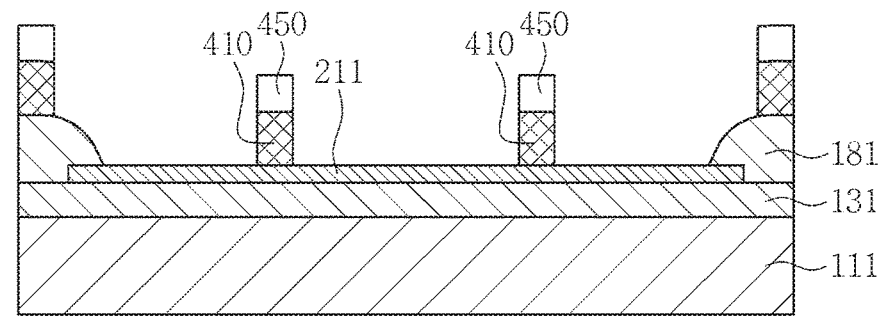

Subsequently, referring to FIG. 15C, the fluorinated polymer compound 411 may be etched using the photoresist pattern 450 as a mask to form a lift-off pattern 410.

Figure 15D:
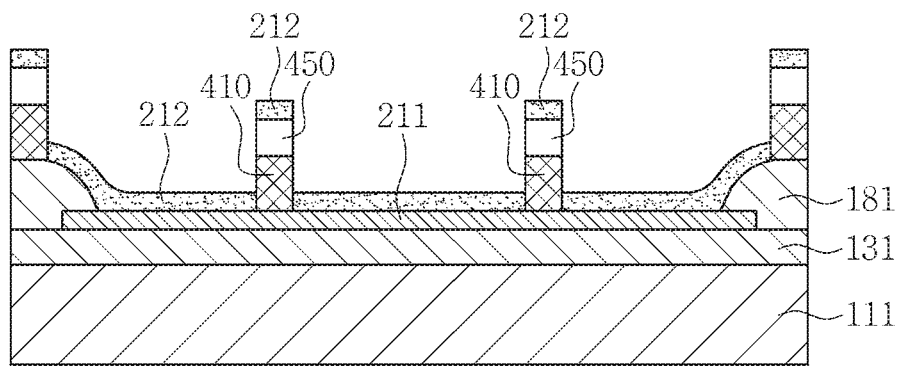

Referring to FIG. 15D, the organic light emitting layer 212 may be coated on the first electrode 211. In this case, the organic light emitting layer 212 may be coated on the photoresist pattern 450 that is formed on the lift-off pattern 410 as well as coated on the first electrode 211.

Figure 15E:
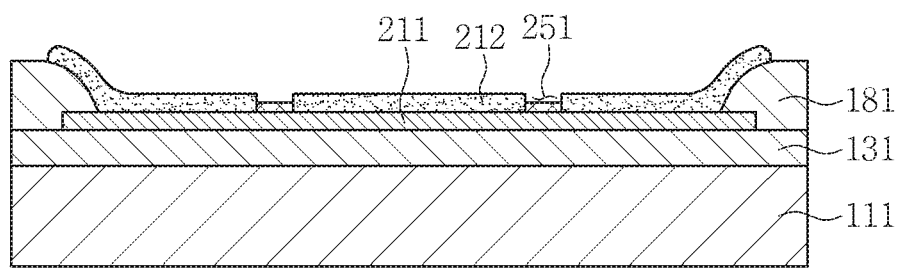

Referring to FIG. 15E, the lift-off pattern 410 is removed. The removing of the lift-off pattern 410 may include dissolving the lift-off pattern 410 using a fluorinated solvent. In this case, the fluorinated solvent may use the mixture of the compound represented by Chemical Formula 1 and the compound represented by Chemical Formula 2 as described above.

When the lift-off pattern 410 is removed, the photoresist pattern 450 coated on the lift-off pattern 410 and the organic light emitting layer 212 on the photoresist pattern 450 may also be removed.

As the lift-off pattern 410 is removed, the opening 251 may be formed to divide the organic light emitting layer 212 into a plurality of light emission patterns.

Figure 15F:
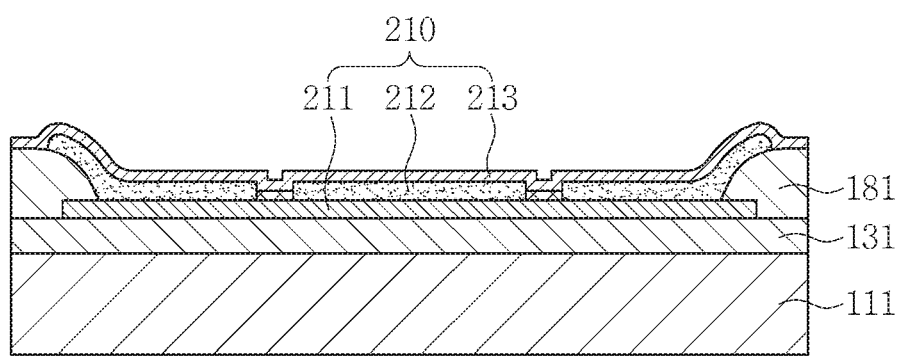

Referring to FIG. 15F, the second electrode 213 may be formed on the organic light emitting layer 212. The second electrode 213 may be disposed in the opening 251 and on the side walls of the divided portions of the organic light emitting layer 212. Accordingly, reflection at the side walls of the divided portions of the organic light emitting layer 212 may be easily performed.

As set forth above, according to one or more exemplary embodiments, the OLED display device may increase light emission efficiency.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light emitting diode display device, comprising:
    a substrate; and
    at least one organic light emitting diode on the substrate,
    wherein the organic light emitting diode comprises:
        a first electrode on the substrate;
        an organic light emitting layer on the first electrode; and
        a second electrode on the organic light emitting layer,
        wherein:
            the organic light emitting layer has at least one opening, and
            the opening is positioned on the first electrode.

2. The organic light emitting diode display device of claim 1, wherein the opening has at least one of a slit shape, a circular shape, a polygonal shape, and a cross (+) shape when viewed from a plan view.

3. The organic light emitting diode display device of claim 1, further comprising a low-refractive-index portion filled in the opening, the low-refractive-index portion having a refractive index lower than the organic light emitting layer.

4. The organic light emitting diode display device of claim 3, wherein the low-refractive-index portion has a refractive index in a range of about 1.0 to about 1.4.

5. The organic light emitting diode display device of claim 3, wherein a difference between refractive indices of the organic light emitting layer and the low-refractive-index portion is about 0.1 or more.

6. The organic light emitting diode display device of claim 3, wherein the low-refractive-index portion comprises at least one of an inert gas, $CaF_2$, NaF, $Na_3AlF_6$, $SiO_x$, $AlF_3$, LiF, $MgF_2$, and $Alq_3$(Tris(8-hydroxyquinolinato)aluminum), an acrylic resin, a polyimide resin, and a polyamide resin.

7. The organic light emitting diode display device of claim 3, wherein the low-refractive-index portion comprises light-scattering particles.

8. The organic light emitting diode display device of claim 1, wherein the second electrode comprises an opening having a shape substantially the same as the opening of the organic light emitting layer.

9. The organic light emitting diode display device of claim 1, wherein the second electrode extends onto the opening of the organic light emitting layer.

10. The organic light emitting diode display device of claim 1, wherein the first electrode is a pixel electrode.

11. The organic light emitting diode display device of claim 1, further comprising, between the first electrode and the organic light emitting layer, at least one of a hole injection layer and a hole transporting layer.

12. The organic light emitting diode display device of claim 1, further comprising, between the organic light emitting layer and the second electrode, at least one of an electron transporting layer and an electron injection layer.

* * * * *